(12) United States Patent
Symons

(10) Patent No.: US 6,380,803 B2
(45) Date of Patent: *Apr. 30, 2002

(54) LINEAR AMPLIFIER HAVING DISCRETE RESONANT CIRCUIT ELEMENTS AND PROVIDING NEAR-CONSTANT EFFICIENCY ACROSS A WIDE RANGE OF OUTPUT POWER

(75) Inventor: Robert Spencer Symons, Los Altos, CA (US)

(73) Assignee: Litton Systems, Inc., Woodland Hills, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/887,796

(22) Filed: Jul. 3, 1997

Related U.S. Application Data

(63) Continuation-in-part of application No. 08/453,569, filed on May 26, 1995, now Pat. No. 5,650,751, which is a continuation of application No. 08/116,457, filed on Sep. 3, 1993, now abandoned.

(51) Int. Cl.[7] .............................................. H01J 25/02
(52) U.S. Cl. ........................ 330/45; 315/5.37; 315/5.38; 313/293; 313/447
(58) Field of Search .............................. 315/4, 5, 5.37, 315/5.39, 5.38; 313/293, 447; 330/44, 45

(56) References Cited

U.S. PATENT DOCUMENTS

| | | | |
|---|---|---|---|
| 2,325,865 A | | 8/1943 | Litton |
| 3,368,104 A | * | 2/1968 | McCullough ............... 315/5.38 |
| 4,096,409 A | | 6/1978 | Hechtel ...................... 315/5.38 |
| 4,101,804 A | * | 7/1978 | Carlsson ................ 315/5.38 X |

(List continued on next page.)

FOREIGN PATENT DOCUMENTS

| | | |
|---|---|---|
| DE | 75 32 912 | 3/1977 |
| EP | 0 181 214 | 5/1986 |
| GB | 547715 | 9/1942 |
| GB | 1 430 005 | 3/1976 |

(List continued on next page.)

OTHER PUBLICATIONS

Design of an 850–MHZ Klystrode by B. Goplen et al., 1990 IEEE, IEDM 90–889–892.

Depressed Collector Klystrons for High–Efficiency UHF Television by Robert S. Symons, presentation at Broadcast Engineering Conference at 1982 National Association of Broadcasters Convention, pp. 90–95.

(List continued on next page.)

Primary Examiner—Benny T. Lee
(74) Attorney, Agent, or Firm—O'Melveny & Myers LLP

(57) ABSTRACT

A linear amplifier comprises an electron gun assembly having a cathode, and an anode spaced from the cathode. A relatively high voltage potential is applied between the anode and the cathode, and the cathode provides an electron beam in response to the relatively high voltage potential. A control grid is spaced between the cathode and the anode, and is coupled to an input port adapted to receive the input signal. The input signal causes the control grid to density modulate the beam. The control grid is also coupled to a bias voltage source to preclude transmission of the electron beam during the negative half cycle of the input signal. A plurality of collector stages are provided with a respective electric potential thereto ranging between a potential of the cathode and a potential of the anode to efficiently collect the electrons of the beam after passing the anode. A first one of the collector stages is spaced from the anode opposite from the control grid and is further coupled to an output port to provide an amplified output signal therefrom. The respective electric potentials of the collector stages have corresponding voltage values such as to provide near-constant and high efficiency across a power range of the input signal.

60 Claims, 6 Drawing Sheets

U.S. PATENT DOCUMENTS

| | | | |
|---|---|---|---|
| 4,277,721 A | * 7/1981 | Kosmahl | 315/5.38 X |
| 4,395,656 A | 7/1983 | Kosmahl | 315/4 |
| 4,480,210 A | 10/1984 | Preist et al. | 315/4 |
| 4,611,149 A | 9/1986 | Nelson | 315/5.39 |
| 4,733,192 A | 3/1988 | Heppinstall et al. | 330/45 |
| 4,737,680 A | 4/1988 | True et al. | 313/349 |
| 4,794,303 A | 12/1988 | Hechtel et al. | 315/5.38 |
| 5,239,272 A | 8/1993 | Bohlen et al. | 330/45 |
| 5,281,923 A | 1/1994 | Heppinstall | 330/45 |
| 5,283,534 A | 2/1994 | Bohlen et al. | 330/45 |
| 5,291,290 A | * 3/1994 | Vaughan et al. | 348/723 |
| 5,317,233 A | 5/1994 | Lien et al. | 315/5.37 |
| 5,420,478 A | 5/1995 | Scheitrum | 315/5.38 |
| 5,440,202 A | 8/1995 | Mathews et al. | 315/3 |
| 5,536,992 A | 7/1996 | Crompton | 313/293 |
| 5,548,245 A | 8/1996 | Bohlen et al. | 330/45 |
| 5,572,092 A | 11/1996 | Shrader | 315/5.37 |
| 5,650,751 A | * 7/1997 | Symons | 315/5.37 |

FOREIGN PATENT DOCUMENTS

| | | |
|---|---|---|
| GB | 1 549 923 | 8/1979 |
| GB | 2 139 413 | 11/1984 |
| GB | 2 143 370 | 2/1985 |
| GB | 2 243 943 | 11/1991 |
| GB | 2 244 854 | 12/1991 |
| GB | 2 245 414 | 1/1992 |
| GB | 2 279 496 | 1/1995 |
| WO | PCT/GB94/00774 | 10/1994 |

OTHER PUBLICATIONS

Modern Multistage Depressed Collectors–A Review, by Henry G. Kosmahl, Proceedings Of The IEEE, vol. 70, No. 11, Nov. 1982, pp. 1325–1334.

The Klystrode–An Unusual Transmitting Tube With Potential for UHF–TV, by Donald H. Preist and Merrald B. Shrader, Proceedings Of The IEEE, vol. 70., No. 11, Nov. 1982, pp. 1318–1325.

Microwave Tubes, by A.G. Gilmour, Jr., Artech House, Inc., 1986, Chapter 8 Gridded Tubes, Section 8.3 Klystrodes, pp. 196–200; Chapter 12 Efficiency Enhancement, pp. 322–340.

A UHF–TV Klystron Using Multistage Depressed Collector Technology, by E.W. McCune, IEDM 86, 1986 IEEE, pp. 160–163.

Some Exciting Adventures in the IOT Business, by Clayworth et al., NAB 1992 Broadcast Engineering Conference Proceedings, pp. 200–208.

A Wide–Band Inductive–Output Amplifier, by Haeff et al., Proceedings of the I.R.E., Mar. 1940, pp. 126–130.

An Ultra–High–Frequency Power Amplifier of Novel Design, by A.V. Haeff, Electronics, Feb. 1939, pp. 30–32.

* cited by examiner

LINEAR AMPLIFIER HAVING DISCRETE RESONANT CIRCUIT ELEMENTS AND PROVIDING NEAR-CONSTANT EFFICIENCY ACROSS A WIDE RANGE OF OUTPUT POWER

CONTINUING APPLICATION DATA

This is a continuation-in-part of Ser. No. 08/453,569, filed May 26, 1995, issued as U.S. Pat. No. 5,650,751 on Jul. 22, 1997, which is a continuation of Ser. No. 08/116,457, filed Sep. 3, 1993, now abandoned.

BACKGROUND OF THE INVENTION

1. Field of the Invention

The present invention relates to amplification of radio frequency (RF) signals in those bands of frequencies in which resonant circuits comprised of discrete inductive and capacitive elements are used, and more particularly, to a linear amplifier which achieves substantially constant efficiency across a designated operating range.

2. Description of Related Art

The advent of high definition television (HDTV) has provoked renewed interest in the efficient amplification of UHF signals. HDTV transmitting systems will require amplifiers capable of extremely high data rates on the order of twenty-five megabits per second. To support these high data rates, digital modulation techniques, such as four or six level vestigial sideband modulation or 16 or 32-state double sideband quadrature amplitude modulation (QAM) are proposed. These forms of modulation, when used in a channel of limited bandwidth (e.g., 6 MHz), result in signals which have high ratios of peak to average power. It is extremely difficult to amplify such signals both efficiently and faithfully, that is, with very low distortion of the modulation content as measured by the absence of high-order intermodulation products. Thus, RF linear amplifiers capable of providing these characteristics are very desirable.

Traditionally, klystrons were used as the high power amplifiers for most UHF transmitters. A klystron is a linear beam device having an electron beam which is passed through a plurality of cavities. An RF input signal velocity modulates the beam and causes it to become bunched. The bunched beam induces an RF current in the cavities, and energy can be extracted from the bunched beam as an amplified RF output signal. However, klystrons are very inefficient at output powers lower than the maximum for which they are designed since they operate at constant voltage and current, and their efficiency is proportional to the output power.

A known technique for increasing the efficiency of a klystron is the use of a multistage depressed collector (MSDC). The electrons of the velocity modulated beam have widely varying energy levels as they exit from the output cavity. By using a multiplicity of collector electrodes which are depressed to potentials below that of the device body (i.e., the potential corresponding to the original electron beam energy), the spent electrons of the beam can be collected at the minimum possible energy. The electrons may be considered analogous to balls having various velocities that might roll up a hill until they stop and then roll back into traps on either side of their upward path. By recovering most of the remaining kinetic energy of the spent electron beam in depressed stages, beam energy is not lost by conversion of the kinetic energy into heat, and higher operating efficiency can be achieved. Multistage depressed collectors are described in Kosmahl, *Modern Multistage Depressed Collectors—A Review*, Proceedings of the IEEE, volume 70, page 1325 (1982).

The efficiency of MSDC klystrons averaged over the modulation cycle has been shown to be up to three times that of conventional klystrons. Since the voltage at which the electrons are collected is roughly proportional to the RF output voltage of the klystron and the beam current is constant, the efficiency of the MSDC klystron is proportional to the square root of the output power. Despite this improved efficiency, MSDC klystrons do not provide the linearity necessary for the proposed HDTV transmitting systems.

Another type of amplifier utilizes one or more grids disposed between a cathode and an anode to density modulate current drawn from the cathode. It is a common practice to differentiate between amplifiers which use a grid to density modulate the electron stream on the basis of their operating regime, and they are categorized as either Class A, B or C. In a Class A amplifier, the grid bias and alternating grid voltages are applied such that the cathode current flows continuously through the electrical cycle. In a Class B amplifier, the control grid is operated at close to cutoff such that cathode current flows only during approximately half of the electrical cycle. Class AB amplifiers are hybrids of Class A and Class B amplifiers in which grid bias and alternating grid voltages are such that the beam current flow appreciatively more than half but less than the entire electrical cycle. Class C amplifiers have the grid bias appreciably greater than cutoff so that cathode current flows for appreciably less than half of the electrical cycle.

At lower frequencies, Class B amplifiers using triodes or tetrodes have demonstrated an ability to produce power more efficiently than conventional klystrons. In these amplifiers, the RF output current varies linearly with the cathode current and the voltage is constant, so the efficiency again varies as the square root of the output power as it does in the MSDC klystron. Tetrode and triode Class B amplifiers are effective for very high frequency (VHF) operation.

The advantages of Class B operation can be extended to higher frequencies by using a device known as an inductive output tube. Inductive output tubes have the same efficiency as other Class B amplifiers due to the fact that the RF input signal applied to a control grid causes the electron beam current to vary roughly as the RF drive voltage. Since the RF current in the tube does not result from velocity modulation, the amplifier is additionally highly linear.

The original inductive output tube was developed by A. V. Haeff, and consisted of a tubular glass envelope containing a cathode, a control grid disposed in front of the cathode, an accelerating aperture electrode and a collecting electrode. A gap of a re-entrant cavity was disposed in part of the tubular glass envelope between the accelerating aperture electrode and the collecting electrode. The electron beam generated by the cathode passed through the gap when focused by a magnetic field. When the electron beam was density modulated by the application of an RF input signal to the control grid at a frequency equal to the resonant frequency of the cavity, the electron beam current induced an electromagnetic wave in the cavity which extracted energy from the electrons without intercepting the electrons. The inductive output tube had the advantage over earlier vacuum tubes in that the interaction gap of the cavity could be of small area and have a low capacitance suitable for high frequency operation, while the electrons could be collected on a much larger collector electrode which no longer needed to be part of the resonant circuit.

The original concept for the inductive output tube was later recognized as being advantageous for use as a linear amplifier for UHF television signals. A modernized inductive output tube is disclosed in U.S. Pat. No. 4,480,210 for GRIDDED ELECTRON POWER TUBE, which includes a highly convergent electron gun with a pyrolytic-graphite control grid and a large collector. Making the control grid of pyrolytic-graphite, a highly refractory material, permits a much higher current density than previously possible in the original Haeff inductive output tube. This updated tube became known as a "klystrode" since it combined features of conventional klystrons with those of tetrodes; the klystrode has the resonant output cavity of a klystron, and the four electrode configuration of the tetrode.

Despite widespread knowledge of MSDC klystron and IOT efficiency enhancing techniques, a combination of the benefits of the inductive output tube with the multistage depressed collector was not actively pursued. The common wisdom in the art was that any improvement in efficiency gained by combining these features would be only on the order of 10% to 15% at peak power levels, and thus would not be worth the additional investment to modify existing designs. See Gilmour, *Microwave Tubes,* pages 196–200 (Artech House 1986). Moreover, it was believed that collector depression would require an increase in the cathode to anode voltage for a given power output, and if too much depression was used in attempting to increase efficiency, a deterioration in picture quality due to returned electrons across the cavity gap would result. See Preist & Shrader, *The Klystrode—An Unusual Transmitting Tube With Potential For UHF-TV,* Proceedings of the IEEE, volume 70, page 1318 (1982).

The parent of this application, U.S. Pat. No. 5,650,751, demonstrated that the conventional teachings in the art failed to recognize that an inductive output tube having a multistage depressed collector can provide near-constant and high efficiency across a power range of an RF signal through careful selection of the electrode stage potentials of the collector electrodes. Thus, it would be desirable to apply these teachings to lower frequency RF amplifiers with resonant circuits comprised of discrete inductive and capacitive elements rather than resonant cavities in order to achieve the same near-constant and high operating efficiency across a power range of the RF signal that has been heretofore demonstrated for UHF frequency levels.

SUMMARY OF THE INVENTION

In accordance with the teachings of this invention, an linear amplifier is provided for amplifying an input signal having a high ratio of peak to average power. The linear amplifier combines the teachings of the inductive output tube with the multistage depressed collector klystron to obtain enhanced operating efficiency and linearity. In the invention, the linear amplifier uses lumped constant resonant circuit elements rather than a tuned cavity in order to extend the advantages of constant high-efficiency operation to lower frequencies at which the sheer size of a cavity resonator would preclude its use.

The linear amplifier comprises an electron gun assembly having a cathode and an anode spaced from the cathode. A relatively high voltage potential is applied between the anode and the cathode, and the cathode provides an electron beam in response to the relatively high voltage potential. A control grid is spaced between the cathode and the anode, and is coupled to an input port adapted to receive the input signal. The input signal causes the control grid to density modulate the beam. The control grid is also coupled to a bias voltage source to preclude transmission of the electron beam during the negative half cycle of the input signal. A plurality of collector stages are provided with a respective electric potential thereto ranging between a potential of the cathode and a potential of the anode to efficiently collect the electrons of the beam after passing the anode. A first one of the collector stages is spaced from the anode opposite from the control grid and is further coupled to an output port to provide an amplified output signal therefrom. The respective electric potentials of the collector stages have corresponding voltage values such as to provide near-constant and high efficiency across a power range of the input signal.

More particularly, the electric potential applied to each respective collector stage is adjusted to preclude collection of the electrons at the relatively high voltage potential. The collector stages are coupled together by capacitors to preclude RF fields from forming therebetween, and the collector stages are coupled to the respective electric potentials through respective inductors. This way, electrons which have given up energy to the output grid will not be reaccelerated or further slowed by the collector stage elements.

A more complete understanding of the low frequency linear amplifier will be afforded to those skilled in the art, as well as a realization of additional advantages and objects thereof, by consideration of the following detailed description of the preferred embodiment. Reference will be made to the appended sheets of drawings which will be first described briefly.

DETAILED DESCRIPTION OF THE PREFERRED EMBODIMENT

The present invention provides an RF amplifier that offers higher operating efficiency levels and linearity than that previously achieved in the art. This improvement is accomplished by combining the high efficiency characteristics of inductive output tubes and multistage depressed collectors, and operating the combined device as a Class B amplifier.

Figure 1:
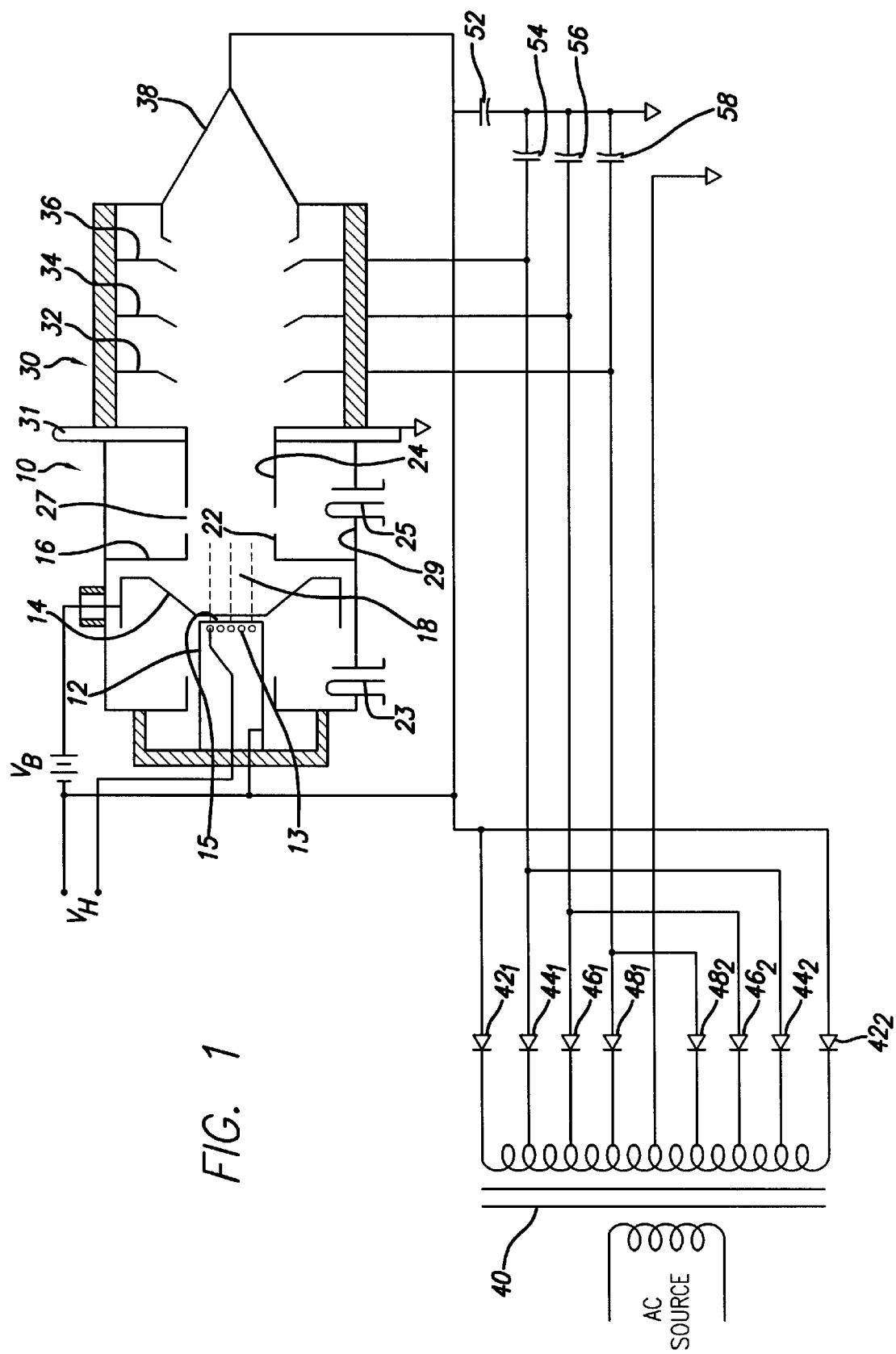
FIG. 1 is a schematic drawing of an inductive output tube having a multistage depressed collector of the present invention.

Referring now to FIG. 1, a schematic drawing of a high efficiency inductive output tube (IOT) 10 having a multistage depressed collector (MSDC) 30 is illustrated. The IOT 10 includes a generally cylindrical electron gun 12 having a thermionic cathode 15 with a heating coil 13 disposed below the cathode surface coupled to a heater voltage source $V_H$. A control grid 14 is positioned closely adjacent to the surface of the cathode 15, and is coupled to a grid bias voltage source $V_B$. An axially apertured anode 16 is disposed downstream from the cathode 15 and control grid 14 at the beginning of a drift tube section which comprises a first portion 22 and a second portion 24. The drift tube portions are separated by a gap 27, which opens to a cavity 29. An RF input 23 comprising an inductive loop is disposed adjacent to the control grid 14 such that an RF input signal is coupled to the grid. Alternatively, input coupling to the control grid 14 may also be capacitative. An RF output 25 comprising a inductive loop is disposed within the cavity 29 for extracting RF electromagnetic energy from the cavity.

The MSDC 30 is axially disposed beyond the drift tube portions at an end of the tube 31, and has a plurality of collector electrodes 32, 34, 36 and 38. Each of the collector electrodes are generally annular-shaped having a funnel portion that tapers in the direction of the IOT 10. A potential is applied to each of the collector electrodes to depress their voltage relative to the IOT 10, as will be fully explained below.

Power to the electron gun 12 and MSDC 30 is provided by a transformer 40 receiving an alternating current (AC) input power source. First rectification diodes $48_1$ and $48_2$ provide potential to the first collector stage 32. Second rectification diodes $46_1$ and $46_2$ provide potential to the second collector stage 34. Third rectification diodes $44_1$ and $44_2$ provide potential to the third collector stage 36. Fourth rectification diodes $42_1$ and $42_2$ provide potential to the fourth collector stage 38. In the embodiment of FIG. 1, the fourth rectification diodes $42_1$ and $42_2$ also provide the same potential level to the cathode 15. Integrating filter capacitors 52, 54, 56 and 58 are respectively included to maintain constant potential on each of the electrodes. The potential applied to each successive collector stage is generally an increasing percentage of the cathode potential, with the final electrode stage being at or near the cathode potential.

An RF input signal is applied between cathode 15 and control grid 14, while a steady DC potential typically between 10 and 30 kilovolts is maintained between the cathode 15 and the anode 16, the anode preferably being at ground potential. An electron beam of high DC energy is formed and accelerated toward the anode 16 at high potential, and passes therethrough with minimal interception. A magnetic field outside the vacuum envelope of the IOT 10 is provided to focus the beam and confine it to a constant diameter as it travels from the IOT 10 to the MSDC 30. The RF input signal which is inducted into the grid 14 modulates the electron beam, forming density modulation or "bunching" of electrons in correspondence with the RF signal frequency, as illustrated at 18 in FIG. 1. The density modulated beam passes through the anode 16 and across the gap 27 between the first and second portions of the drift tube. Passage across the gap 27 induces a corresponding electromagnetic wave RF signal in the output cavity 29 which is highly amplified as compared to the input signal. This RF wave energy is then extracted from the tube 10 via the output 25, by use of inductive or capacitive coupling.

After passing through the drift tube portions 22 and 24, the now spent electron beam enters the MSDC 30. Depending on the energy of the electrons within the beam, the electrons are efficiently collected on one of the collector electrodes 32, 34, 36 or 38. Electrons having the highest energy level would travel all the way to the fourth depressed collector stage 38, while the electrons with lesser amounts of energy would be collected on one of the previous stages.

By operating the IOT 10 as a Class B amplifier, no electron beam current from the cathode flows through the grid 14 during the negative half cycle of the RF input signal to the grid. During each positive half cycle, a pulse of RF current flows through the cavity 29 and gives up some of its energy to the electric field formed in the gap 27. Both the height of the current pulse and the average current in the chain of pulses will increase as the RF driving voltage on the control grid is increased, and the RF current in the chain of pulses, $I_{RF}$, will increase in proportion to the DC beam current I. Thus, the output power of the IOT is equal to $I_{RF}^2 R$, where R is the shunt resistance presented to the beam at the gap 27. In the multistage depressed collector, the minimum excess energy of the electrons emerging from the tube will be proportional to the difference between the DC beam voltage and the RF voltage. This excess energy is recovered by collecting the electrons on the collector stages at potentials between the cathode voltage and the beam voltage. As the RF driving voltage is increased, the RF current in the cavity causes a voltage $V_{RF}$ to appear across the shunt resistance. Thus, if there are enough collector stages so the collection potential is near the DC beam potential minus $V_{RF}$, the DC input power to the tube is very nearly proportional to $V_{RF} I$.

By combining the inductive output tube 10 with the multistage depressed collector 30, a surprising result is obtained. Not only will the DC beam current be proportional to $I_{RF}$, but the effective beam collection voltage will be proportional to $V_{RF}$ and the input power to the IOT 10 will be proportional to $I_{RF} V_{RF}$, or its output power. The efficiency for the IOT across a full range of power for the IOT is very nearly constant and independent of the level at which the amplifier is operating. Not only is the peak efficiency of the IOT increased by collecting the electrons more efficiently at maximum power, but very near peak efficiency is obtained at all levels of operation. By increasing the beam voltage and beam current to levels sufficient to sustain a very high instantaneous power, and avoiding the collection of any of this current on electrodes held at this potential, the IOT can achieve extremely linear amplification. All the beam current would be collected on the depressed stages and there would be no efficiency penalty.

Although FIG. 1 discloses a collector 30 having four depressed stages, it should be apparent that five, six or any number could be advantageously utilized. However, as the number of collector stages increases, the complexity of the device also increases to a point in which the benefit of increased efficiency is overcome by the complexity. In actuality, the end of the IOT 10 structure before the collector 30, illustrated at 31 in FIG. 1, is at the anode potential and may act as a first collector electrode. As will be explained below, when the RF output voltage is limited to improve linearity, maximum efficiency is obtained by precluding collection of the spent electrons on this first electrode at anode potential.

Figure 2:
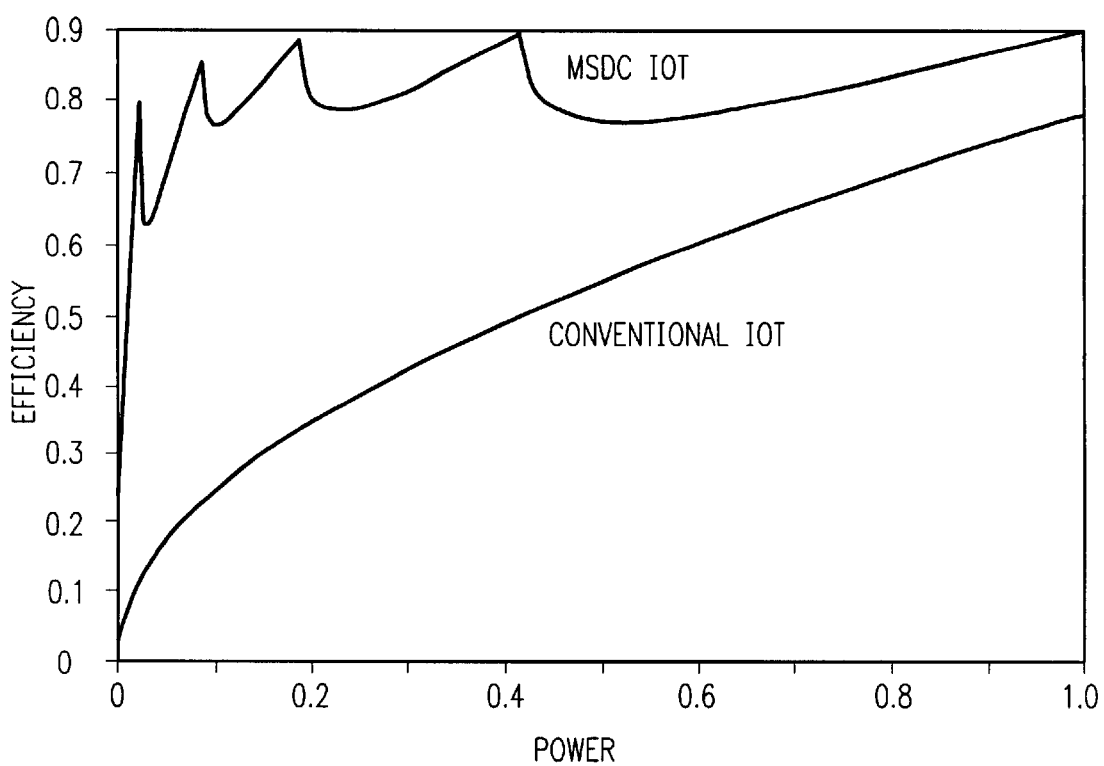
FIG. 2 is a graph depicting expected efficiency for an inductive output tube using five depressed collector stages.

The exact voltages selected for each stage should be adjusted to minimize the power input to the IOT for the particular statistical character of the RF signal being amplified. For example, FIG. 2 shows the theoretical efficiency for an IOT of the present invention having five depressed collector stages at 0.7, 0.45, 0.3, 0.2 and 0.1 times the beam voltage and a maximum RF output cavity voltage equal to 0.7 times the beam voltage, compared with the efficiency of a conventional IOT. Each of the efficiency peaks for the MSDC IOT in FIG. 2 correspond with the particular collector electrode potentials which were selected. The efficiencies were calculated assuming half sine wave current pulses and sinusoidal output gap voltages. This assumption results in 78.5% maximum efficiency for the conventional IOT and efficiencies between 80% and 90% over most of the power range for the MSDC IOT. Note that the actual value experienced in UHF amplifier practice for either the conventional or MSDC IOT would be somewhat reduced due to space charge effects and transit time spreading of the electrons.

Figure 3:
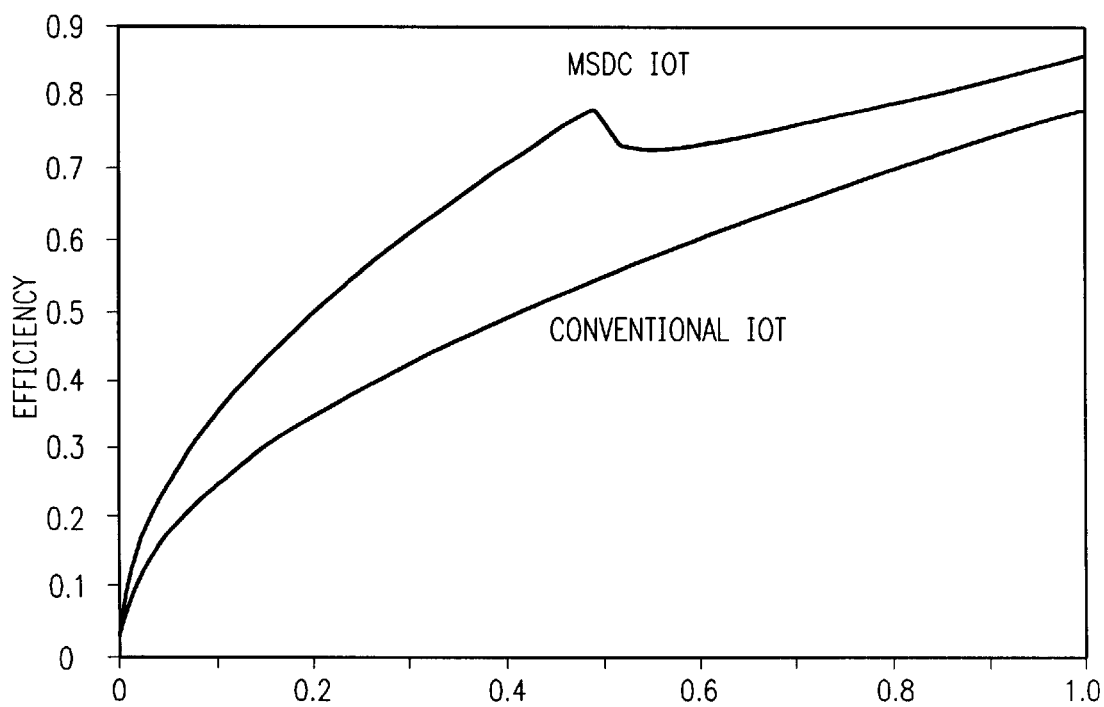
FIG. 3 is a graph depicting expected efficiency for an inductive output tube having a first collector electrode formed by the tube structure at full beam potential and a second collector electrode at a depressed voltage.

Improved efficiency can be realized by the present invention over a narrower range of power output with only a single depressed collector electrode having a potential selected to coincide with the lowest power output required. For example, FIG. 3 shows the efficiency of an IOT with the end of the IOT acting as a first collector electrode at full beam voltage, and with a second electrode within the collector 30 depressed to 0.7 times the beam voltage, compared with the efficiency of a conventional IOT. Thus, the RF amplifier of the present invention is adjusted to provide near constant high efficiency at any power level between one-half maximum power and maximum, rather than the square root of output power relationship provided by inductive output tubes and multistage depressed collector klystrons.

It will be apparent to those skilled in the art that by varying the number of depressed collector stages and their respective potentials, one can optimize average efficiency for any statistical character of the signal being amplified. Since an HDTV transmitting system would be expected to operate with a mean power 0.25 times the maximum power, several low voltage electrodes will be necessary for maximum energy recovery at this operating level.

Figure 4:
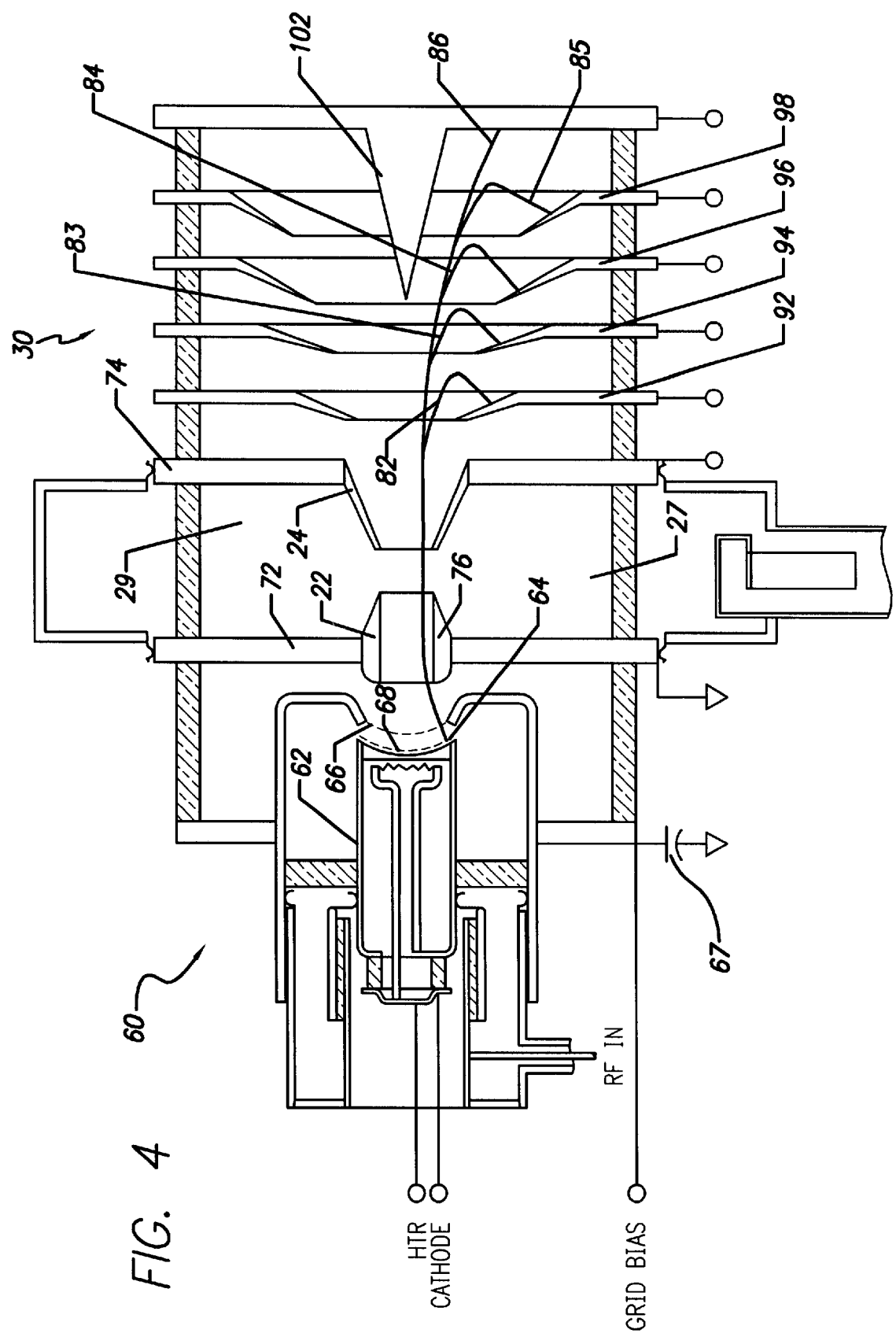
FIG. 4 is a side view of an embodiment of the MSDC inductive output tube of the present invention.

In an embodiment of the present invention, an IOT 60 having a MSDC is illustrated in FIG. 4, in which like elements from the schematic of FIG. 1 share like numerals and are not all described in detail. The IOT 60 has a modified cathode 62 having an optional shadow grid 64, a control grid 66, and a convergent cathode surface 68. The cathode 62 is coupled to a thermionic heater voltage source (illustrated as HTR in FIG. 4) and an emitting surface voltage source (illustrated as CATHODE in FIG. 4). The shadow grid 64 and the control grid 66 can be formed of a perforated or wire mesh-like material of a refractory metal, such as molybdenum or tungsten, and may be coated with a primary electron emission suppression material, such as titanium. The shadow grid 64 is operated at a DC potential at or very close to the cathode potential, and the control grid 66 receives the RF input signal (illustrated as RF IN in FIG. 4). Capacitor 67 provides a return path for the RF input signal to ground. The shadow grid 64 shadows the control grid 66 so that no electrons strike the control grid. Since the control grid 66 reaches a fairly high positive potential at the peak of the RF drive voltage, shielding it from electrons by interposing the shadow grid 64 between it and the cathode 62 substantially reduces the grid heating power, the temperature of the grid, and the likelihood of primary electron emission from the grid. A shadow grid arrangement is disclosed in U.S. Pat. No. 4,737,680, for GRIDDED ELECTRON GUN, which is owned by the common assignee.

The convergent cathode surface 68 is generally concave, with the shadow grid 64 and control grid 66 having similar shapes. An anode 76 is formed by the front of the first drift tube portion 22, and is at ground potential. The electric field lines from the control grid 66 and the anode 76 reach through the shadow grid 64 and make the off-cathode potential gradient in the absence of space charge positive over some area behind the openings in the grids from which the cathode emits electrons. By adjusting the average (bias) voltages of the shadow grid 64 and control grid 66 with respect to the cathode surface 68 (illustrated as GRID BIAS in FIG. 4), improved linearity of the cathode current as a function of the RF control grid voltage can be achieved.

Electrons thermionically emitted from the cathode surface 66 follow a path generally perpendicular to the cathode surface, and become focused into a generally linear beam by the magnetic field directed into the IOT from outside the vacuum envelope. The magnetic field may be provided by a solenoid magnet (not shown), and is directed into the device by iron plates 72 and 74 on either side of the output cavity 29. The size of the hole through the plate 72 contributes to shaping the magnetic field in the region between the cathode 62 and the anode 76 so that the magnetic field lines are fairly similar to the desired electron trajectories. This way, all emitted electrons are guided from the cathode surface 68, through the anode 76, through the output cavity 29 and into the collector region at all current levels. The collector includes five depressed stages illustrated at 92, 94, 96, 98 and 102. As explained above, the end of the IOT structure 74 acts as a first collector stage, and is at the anode potential. The final collector stage 102 is shaped as a spike to form a radial electric field region to force incoming electrons radially outward so that they impinge perpendicularly onto one of the previous collector electrodes.

The pulses of beam current passing through the gap 27 of the output cavity 29 induce magnetic and electric fields in the cavity, and the electric field extracts energy from the electrons. At low currents, the fields in the output cavity 29 will be low and the minimum energy of the electrons leaving the gap 27 will be high. At high currents, the cavity fields will be high and the minimum energy of the electrons leaving the output cavity will be low. Depending upon the current level and the instantaneous fields in the output cavity, an electron might follow a trajectory similar one of to those marked as 82, 83, 84, 85 or 86. Because the collector electrodes are connected to decreasing potentials, the more energy an electron has, the more deeply it will penetrate into the MSDC 30. When it has lost all its energy, it will turn around and be collected by the first collector stage it hits. Fortunately, space-charge forces push the electrons outward radially, and there is a high probability that an electron will be collected on the collector stage of the lowest possible potential.

Amplitude and phase distortion are the result of nearly stopping some electrons in the output gap. To achieve excellent amplitude linearity and low phase distortion, the RF voltage at the output gap 27 should be maintained between approximately 90 and 75% of the cathode to anode potential. At this voltage, the slowest electrons would have between approximately 10 and 25% of the original beam energy or about 32 to 50% of the original beam velocity. This can be achieved by adjusting the impedance of the output gap. If the first collector electrode 92 has a potential equal to the peak amplitude of the RF cavity gap voltage, all of the current can be collected on the collector electrodes, and the efficiency will be higher than that of existing inductive output tubes without depressed collectors while providing much more faithful amplification of the signal.

It should be apparent to those skilled in the art that a functional inductive output tube with a multistage depressed collector will require cooling devices to maintain the temperature of the collector within a reasonable range. Such cooling devices may include a water jacket, or air fins. In addition, bi-metallic structures would typically be incorporated to compensate for differential thermal expansion.

Figure 5:
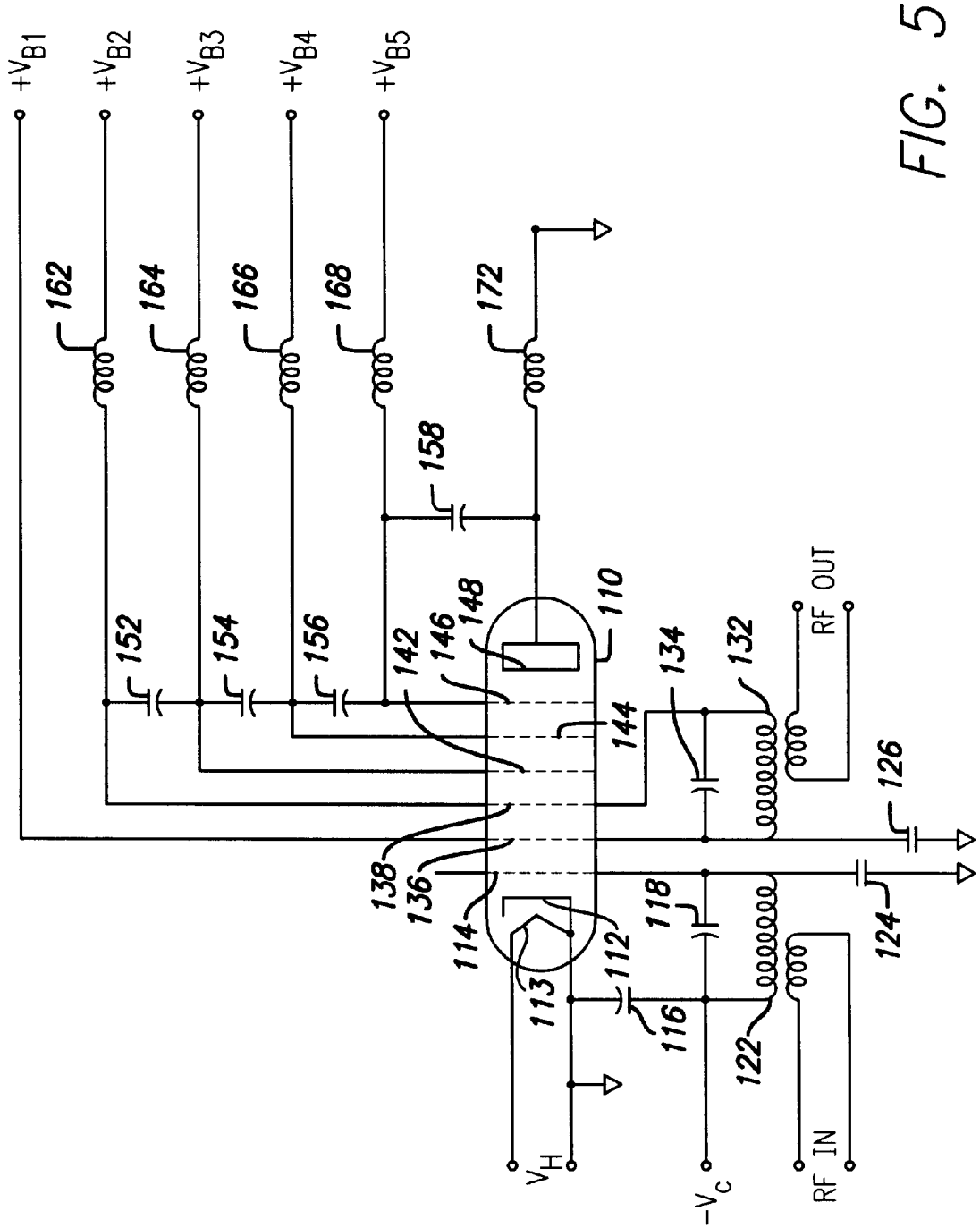
FIG. 5 is a schematic drawing of a linear amplification device for low frequency signals using electrode grids.

Referring now to FIG. 5, an alternative embodiment of the invention is provided in which the above teachings are applied to the amplification of low frequency signals. It should be appreciated that the above-described devices would not be practical for use in amplifying RF signals in a frequency range lower than 100 MHz, since the size of the input and output cavities would necessarily be very large. Accordingly, the linear amplifier of FIG. 5 uses lumped constant resonant circuit elements rather than tuned cavities in order to extend the advantages of constant high-efficiency operation to low frequency signal amplification. It is anticipated that the linear amplifier of FIG. 5 be used to amplify input signals from the VHF range (i.e., 30–300 MHz) down through the ELF range (i.e., less than 3 KHz).

The linear amplifier of FIG. 5 comprises a generally cylindrical tube 110 having a thermionic cathode 112 disposed at a first end thereof. The linear amplifier further comprises a control grid 114 positioned closely adjacent to the surface of the cathode 112, an anode 136 disposed downstream from the cathode and control grid, and a plurality of collector elements 138, 142, 144, 146 following the anode. A final collector electrode 148 is disposed after the collector elements 138, 142, 144, 146 at a second end of the tube 110. The anode 136 and collector elements 138, 142, 144 and 146 are shown schematically as grids as is conventional in such diagrams, though they will more likely be provided by metallic plates with a hole through each to allow passage of electrons, as shown in the other figures.

The cathode 112 includes a heating element 113 disposed below the surface of the cathode, and is coupled to a heater voltage source $V_H$. One terminal of the heating element 113 is coupled to ground. The control grid 114 and the anode 136 are coupled to ground through respective bypass capacitors 124, 126. The anode 136 is coupled to a positive voltage source $+V_{B1}$ to apply a positive voltage potential thereon. The collector elements 138, 142, 144, 146 have respective voltage potentials applied thereto from respective voltage sources $+V_{B2}$, $+V_{B3}$, $+V_{B4}$, $+V_{B5}$ through respective inductors 162, 164, 166, 168. The final collector electrode 148 may be comprised of a conductive plate, such as copper, and is coupled to ground through an inductor 172. Alternatively, the final collector electrode 148 may have an axially extending point to contribute to electric field shaping within the tube 110. The collector elements 138, 142, 144, 146 and the collector electrode 148 are coupled together by respective capacitors 152, 154, 156, 158. The voltage potential applied to each successive collector element is generally an increasing percentage of the cathode potential, with the final electrode being at or near the cathode potential.

An input circuit 122 has a primary winding coupled across an input port (illustrated as RF IN) and a secondary winding resonated by a capacitor 118 coupled between the control grid 114 and a control grid bias voltage source $-V_C$ terminal. Capacitor 116 is used to isolate the cathode 112 from the input circuit 122. An output circuit 132 has a secondary winding coupled across an output port (illustrated as RF OUT) and a primary winding resonated by a capacitor 134 coupled between the anode 136 and the first collector element 138. The input circuit 122 and capacitor 118 operate in the same manner as the input cavity of the previously described high frequency devices, and similarly, the output circuit 132 and capacitor 134 operate in the same manner as the output cavity.

The positive voltage potential at the anode 136 causes an electron beam of high DC energy to be accelerated toward the anode 136 at high potential, and passes therethrough with minimal interception. An input signal applied to the input port is inductively coupled through the transformer 122 to the control grid 114. In the same manner as the high frequency devices described above, the input signal density modulates the electron beam provided from the cathode 112, forming density modulation or "bunching" of electrons in correspondence with the input signal frequency. The density modulated beam passes through the anode 136 and across the gap defined between the anode and the first one of the collector elements 138 to induce a corresponding electromagnetic signal in the output transformer 132 which is highly amplified as compared to the input signal. This output signal is then extracted from the tube 110 via the output port.

The control grid bias voltage source $-V_C$ causes the linear amplifier to operate as a Class B amplifier. Accordingly, no electron beam current from the cathode 112 flows through the control grid 114 during the negative half cycle of the input signal to the control grid. During each positive half cycle, a pulse of current flows from the cathode 112 through the control grid 114 due to the RF voltage across the secondary windings of the input circuit 122. Both the height of the current pulse and the average current in the chain of pulses will increase as the driving voltage on the control grid 114 is increased, and the RF current in the chain of pulses will increase in proportion to the DC beam current I. The output power of the linear amplifier is proportional to $I^2R$, where R is the shunt resistance presented to the beam at the gap, thus exhibiting the same characteristics as the high frequency devices described above.

In order to obtain the same electron collection efficiency as the multistage depressed collectors of the high frequency devices, it is necessary to exclude RF electric fields from the region between the collector elements so that electrons which gave up energy to the gap will not be reaccelerated or further slowed in the collector. In the linear amplifier of FIG. 5, the connecting capacitors 152, 154, 156, 158 present a low impedance to RF currents between the collector elements 138, 142, 144, 146 and the final electrode 148. As a result, the collector elements 138, 142, 144, 146 and the final electrode 148 rise and fall in potential together at the input signal frequency. The collector elements 138, 142, 144, 146 and the final electrode 148 are thus connected to their respective voltage sources through the inductors 162, 164, 166, 168, 172 which act as RF chokes. The exact voltages selected for each collector element should be adjusted to minimize the power input to the amplifier for the particular statistical character of the signal being amplified.

As in the high frequency devices, the efficiency for the low frequency linear amplifier across a full range of power is very nearly constant and independent of the level at which the amplifier is operating. Not only is the peak efficiency of the linear amplifier increased by collecting the electrons more efficiently at maximum power, but very near peak efficiency is obtained at all levels of operation. By increasing the beam voltage and beam current to levels sufficient to sustain a very high instantaneous power, and avoiding the collection of any of this current on collector elements held at this potential, the amplifier can achieve extremely linear amplification. All the beam current would be collected on the depressed stages and there would be no efficiency penalty.

In another embodiment of the invention, a constant efficiency device could also be constructed by combining the teachings of the various embodiments described above. Particularly, such a device could be constructed using the IOT 10 and MSDC 30 of FIG. 1, but with the lumped constant resonant circuits of FIG. 5 substituted for the resonant cavities. This way, an existing IOT device could be modified to operate at low frequencies. An example of such a device is illustrated in FIG. 6.

Figure 6:
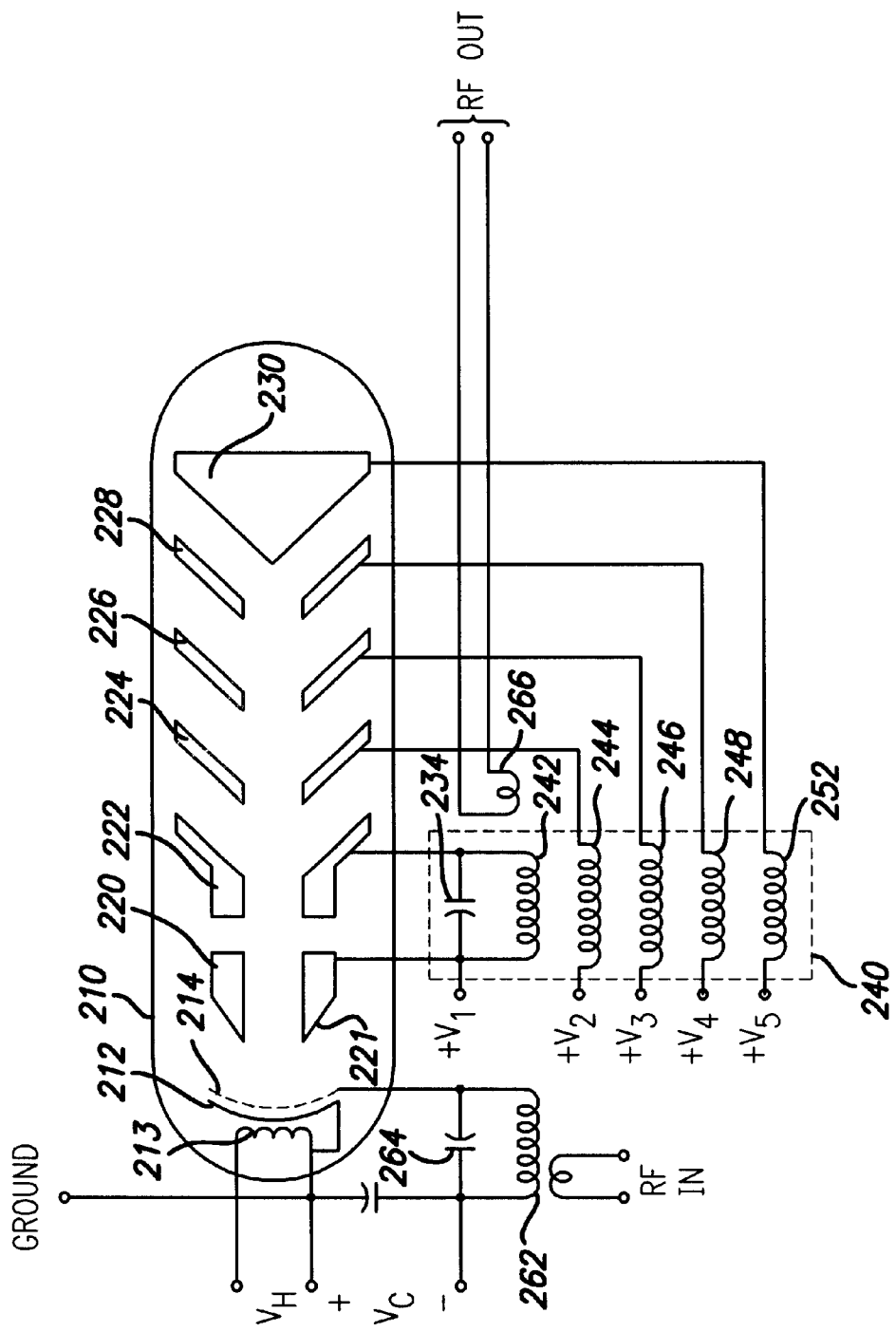
FIG. 6 is an alternative embodiment of the linear amplification device of FIG. 5.

More particularly, the linear amplifier of FIG. 6 comprises a generally cylindrical tube 210 having a thermionic cathode 212 disposed at a first end thereof and a control grid 214 positioned closely adjacent to the surface of the cathode. The control grid 214 may be comprised of a perforated or wire mesh-like material of a refractory metal, such as molybdenum or tungsten, and may be coated with a primary electron emission suppression material, such as titanium. The cathode 212 and control grid 214 of FIG. 6 include a generally concave surface, though it should be appreciated that alternative shapes may also be utilized to achieve desired electron beam shape characteristics, as known in the art.

An annular-shaped anode electrode 220 is disposed downstream from the cathode 212 and control grid 214. As shown in FIG. 6, the anode electrode 220 has a tapered leading edge surface 221. A plurality of collector electrodes 222, 224, 226, 228 are disposed serially following the anode electrode 220, and are generally annular with a conical shape as in depressed collector electrodes of conventional high frequency devices. A final collector electrode 230 is disposed after the collector electrodes 222, 224, 226, 228 at a second end of the tube 210. A gap is defined between the anode electrode 220 and the first collector electrode 222, and the two electrodes have blunt surfaces that face each other across the gap. Each of the anode electrode 220, and the collector electrodes 222, 224, 226, 228 may be comprised of an electrically and thermally conductive material, such as copper.

As in the embodiment of FIG. 5, the cathode 212 of the FIG. 6 embodiment includes a heating element 213 disposed below the surface of the cathode, and is coupled to a heater voltage source $V_H$. The anode electrode 220 is coupled to a positive voltage source $+V_1$ to apply a positive voltage potential thereon. The first collector electrode 222 is also coupled to $+V_1$ through a parallel resonant circuit provided by an inductor 242 and capacitor 234. The collector electrodes 224, 226, 228 and 230 have respective voltage potentials applied thereto from respective voltage sources $+V_2$, $+V_3$, $+V_4$, $+V_5$ through respective inductors 244, 246, 248, 252. The inductors 242, 244, 246, 248 and 252 are coupled together inductively so the same RF voltage appears across all of them, and may be comprised of a single inductive element 240, which will be described in greater detail below with respect to FIG. 7. As in the preceding embodiments, the voltage potential applied to each successive collector electrode is generally an increasing percentage of the cathode potential, with the final electrode stage being at or near the cathode potential. The inductors 244, 246, 248, 252 operate to exclude RF electric fields from the region between the collector electrodes so that electrons which gave up energy to the gap will not be reaccelerated or further slowed in the collector.

An input transformer 262 has a primary winding coupled across an input port (illustrated as RF IN) and a secondary winding resonated with a capacitor 264 coupled between the control grid 214 and a control grid bias voltage source $V_C$ terminal. It should be appreciated that the control grid bias voltage $V_C$ as shown in FIG. 6 is negative with respect to ground, as reflected by the voltage being applied to the negative (−) terminal, with the positive terminal (+) coupled to ground. An output transformer is formed by a secondary winding 266 coupled across an output port (illustrated as RF OUT) and a primary winding provided by inductor 242 coupled between the anode electrode 220 and the first collector electrode 222. The input transformer 262 and capacitor 264 operate in the same manner as the input cavity of the previously described high frequency devices, and similarly, the output transformer formed by secondary winding 266, inductor 242 and capacitor 234 operate in the same manner as the output cavity.

As in the previous embodiments, the control grid bias voltage source $V_C$ causes the linear amplifier to operate as a Class B amplifier. Accordingly, no electron beam current from the cathode 212 flows through the control grid 214 during the negative half cycle of the input signal to the control grid. During each positive half cycle, a pulse of current flows through the control grid 214 and gives up some of its energy to the electric field formed in the gap between the anode electrode 220 and the first collector electrode 222. Both the height of the current pulse and the average current in the chain of pulses will increase as the driving voltage on the control grid 214 is increased, and the current in the chain of pulses will increase in proportion to the DC beam current I. The output power of the linear amplifier is proportional to $I^2R$, where R is the shunt resistance presented to the beam at the gap, thus exhibiting the same characteristics as the high frequency devices described above.

Figure 7:
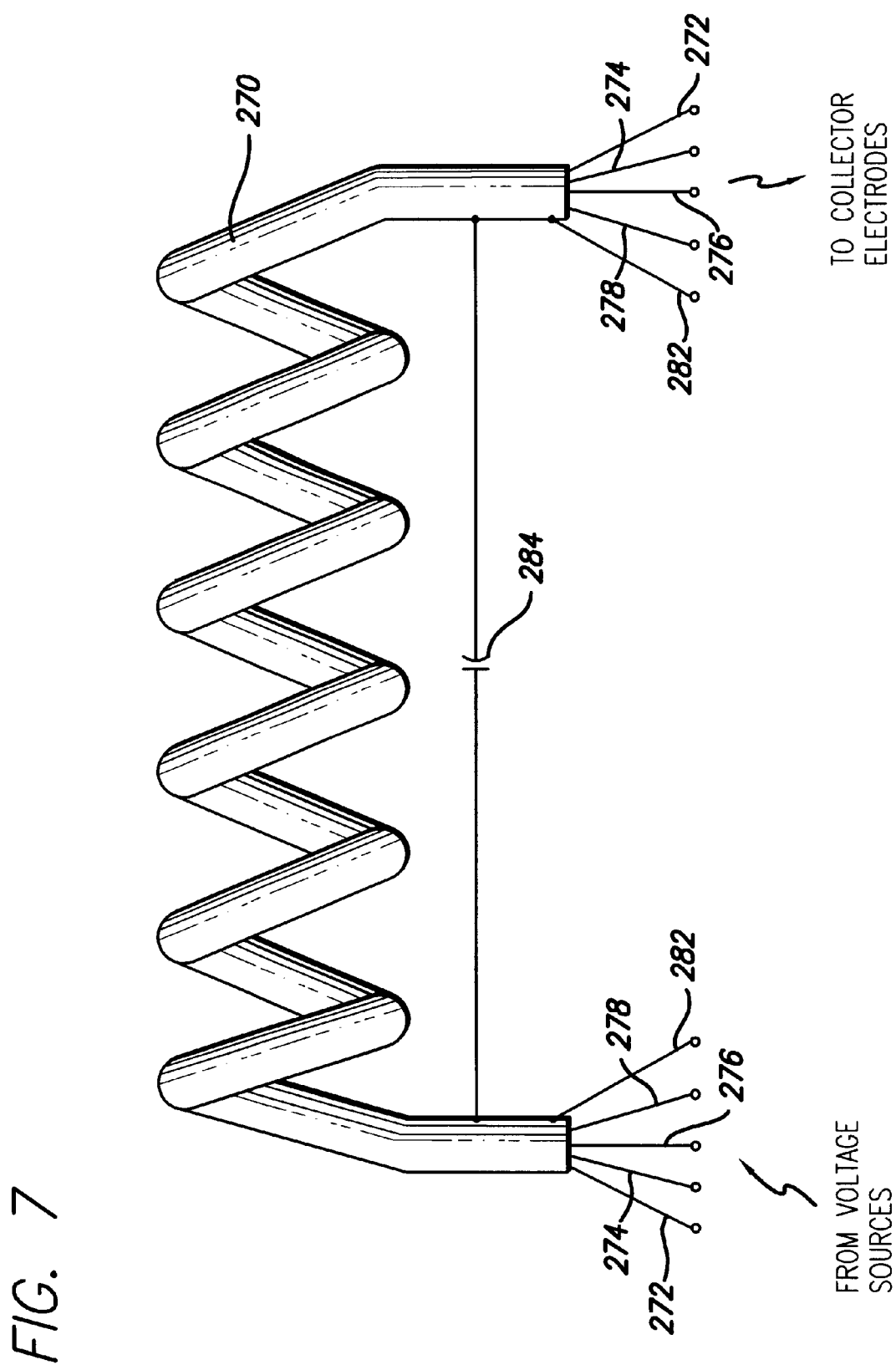
FIG. 7 is a resonant circuit inductor element for use in the alternative embodiment of FIG. 6.

The individual inductors 242, 244, 246, 248, 252 used to couple the voltage supplies to the collector electrodes are tightly coupled together inductively so that no RF voltage exists between elements 222, 224, 226, 228 and 230. It is also possible to combine them into a single inductive element, such as 240. For example, the insulated wires that are used to couple to the respective collector electrodes may be twisted together along with the wire of the resonator circuit coupled across the gap, and formed into a helix to form all the inductors. A second method of construction of the inductive elements is illustrated in FIG. 7, which illustrates a resonant inductor tube 270 and wires 282, 272, 274, 276, 278 that perform the functions of the inductors 242, 248, 246, 244, and 252, respectively. The wires 282, 272, 274, 276, 278 have a first end (illustrated as FROM VOLTAGE SOURCES) coupled to the voltage sources $+V_1$, $+V_2$, $+V_3$, $+V_4$, $+V_5$, respectively (see FIG. 6), and a second end (illustrated as TO COLLECTOR ELECTRODES) coupled to the electrodes 220, 222, 224, 226, 228, respectively (see FIG. 6). The inductor tube 270 may be comprised of electrically conductive material, such as copper, that is formed into a helix. A resonant circuit capacitor 284 is coupled across ends of the inductor tube 270, and performs the function of capacitor 234. It should be appreciated that the inductor tube 270 provides the inductor 242 illustrated in FIG. 6.

Having thus described a preferred embodiment of an inductive output tube with multistage depressed collector electrodes and methods of adjusting it to achieve optimum performance when amplifying signals with different statistical characteristics, it should now be apparent to those skilled in the art that the aforestated objects and advantages for the within system have been achieved. It should also be appreciated by those skilled in the art that various modifications, adaptations and alternative embodiments thereof may be made within the scope and spirit of the present invention, which is further defined by the following claims.

What is claimed is:

1. An amplifying apparatus, comprising:
   an electron gun assembly having a cathode and an anode spaced therefrom, said cathode being coupled to a voltage source providing said cathode with a relatively high voltage potential relative to a potential of said anode, said cathode providing an electron beam in response to said relatively high voltage potential;
   a control grid spaced between said cathode and anode, and being coupled to an input source that applies a radio frequency signal to said grid in order to density modulate said beam, said radio frequency signal having a statistical power distribution corresponding to a high ratio of peak to average power, said grid being coupled to a first bias voltage source providing said grid with a first bias voltage relative to said cathode to preclude transmission of said electron beam during a portion of a full cycle of said radio frequency input signal;

a drift tube spaced from said electron gun and surrounding said beam and including a first portion and a second portion, a gap being defined between said first and second portions;

an output cavity coupled with said drift tube, said density modulated beam passing across said gap and coupling an amplified radio frequency signal into said cavity; and a collector spaced from said drift tube, the electrons of said beam passing into said collector after transit across said gap, said collector having a plurality of electrode stages each having a respective electric potential applied thereto ranging between said anode potential and said cathode potential, said respective electrode stage potentials having corresponding voltage values to substantially reduce power input to said apparatus for said statistical power distribution of said radio frequency signal across a power range of said radio frequency signal in comparison to a conventional amplifying apparatus comprised of an electron gun assembly, control grid, drift tube and output cavity substantially as set forth above and a collector having a single stage collector electrode, wherein one of said plurality of electrode stages has a respective electric potential equal to said cathode potential.

2. The amplifying apparatus of claim 1, wherein said radio frequency signal further comprises a radio frequency carrier modulated by a digital television signal.

3. An amplifying apparatus, comprising:

an electron gun assembly having a cathode and an anode spaced therefrom, said cathode being coupled to a voltage source providing said cathode with a relatively high voltage potential relative to a potential of said anode, said cathode providing an electron beam in response to said relatively high voltage potential;

a control grid spaced between said cathode and anode, and being coupled to an input source that applies a radio frequency signal to said grid in order to density modulate said beam, said radio frequency signal having a statistical power distribution corresponding to a high ratio of peak to average power, said grid being coupled to a first bias voltage source providing said grid with a first bias voltage relative to said cathode to preclude transmission of said electron beam during a portion of a full cycle of said radio frequency input signal;

a drift tube spaced from said electron gun and surrounding said beam and including a first portion and a second portion, a gap being defined between said first and second portions;

an output cavity coupled with said drift tube, said density modulated beam passing across said gap and coupling an amplified radio frequency signal into said cavity; and a collector spaced from said drift tube, the electrons of said beam passing into said collector after transit across said gap, said collector having a plurality of electrode stages each having a respective electric potential applied thereto ranging between said anode potential and said cathode potential, said respective electrode stage potentials having corresponding voltage values to substantially reduce power input to said apparatus for said statistical power distribution of said radio frequency signal across a power range of said radio frequency signal in comparison to a conventional amplifying apparatus comprised of an electron gun assembly, control grid, drift tube and output cavity substantially as set forth above and a collector having a single stage collector electrode, wherein one of said plurality of electrode stages has a respective electric potential equal to said anode potential.

4. The amplifying apparatus of claim 3, wherein said radio frequency signal further comprises a radio frequency carrier modulated by a digital television signal.

5. A linear amplifier, comprising:

an electron gun assembly having a cathode;

an anode spaced from said cathode;

means for applying a relatively high voltage potential between said anode and said cathode, said cathode providing an electron beam in response to said relatively high voltage potential;

a control grid spaced between said cathode and anode, said control grid being coupled to an input port adapted to receive an input signal having a high ratio of peak to average power, said input signal causing said control grid to density modulate said beam, said control grid being further coupled to a bias voltage source to preclude transmission of said electron beam during a portion of a full cycle of said input signal; and a plurality of collector stages each having a respective electric potential applied thereto ranging between a potential of said cathode and a potential of said anode to efficiently collect said electrons of said beam after passing said anode, a first one of said collector stages being spaced from said anode opposite from said control grid and coupled to an output port, said output port providing an amplified output signal therefrom, said respective electric potentials of said collector stages having corresponding voltage values such as to provide near-constant and high efficiency across a power range of said input signal wherein said input and output ports are provided by lumped element resonant circuits, and said input signal further comprises an RF signal having a frequency in a range operable with said lumped element resonant circuits of said input and output ports.

6. An amplifying apparatus, comprising:

an electron gun assembly having a cathode and an anode spaced therefrom, said cathode being coupled to a voltage source providing said cathode with a relatively high voltage potential relative to a corresponding potential of said anode, said cathode providing an electron beam in response to said relatively high voltage potential;

a control grid spaced between said cathode and anode, and being coupled to an input source that applies a radio frequency signal to said grid in order to density modulate said beam, said radio frequency signal having a statistical power distribution corresponding to a high ratio of peak to average power, said grid being coupled to a first bias voltage source providing said grid with a first bias voltage relative to said cathode to preclude transmission of said electron beam during a portion of a full cycle of said radio frequency input signal;

a drift tube spaced from said electron gun and surrounding said beam and including a first portion and a second portion, a gap being defined between said first and second portions;

an output cavity coupled with said drift tube, said density modulated beam passing across said gap and coupling an amplified radio frequency signal into said cavity; and a collector spaced from said drift tube, the electrons of said beam passing into said collector after transit across said gap, said collector having a plurality of electrode stages each having a respective electric potential applied thereto ranging between said anode potential and said cathode potential, said respective electrode stage potentials having corresponding voltage values to substantially reduce power input to said apparatus for said statistical power distribution of said radio frequency signal across a power range of said radio frequency signal in comparison to a conventional amplifying apparatus comprised of an electron gun assembly, control grid, drift tube and output cavity substantially as set forth above and a collector having a single stage collector electrode, wherein said radio frequency input signal further comprises a digital television signal modulating a radio frequency carrier.

7. An amplifying apparatus, comprising:

an electron gun assembly having a cathode and an anode spaced therefrom, said cathode being coupled to a voltage source providing said cathode with a relatively high negative voltage potential relative to a corresponding potential of said anode, said cathode providing an electron beam in response to said relatively high negative voltage potential;

an input source providing an input signal comprising a radio frequency carrier modulated by a digital television signal, said input signal having a statistical power distribution corresponding to a high ratio of peak to average power;

a control grid spaced between said cathode and anode, and being coupled to said input source to apply said input signal to said grid in order to density modulate said beam, said grid being coupled to a first bias voltage source providing said grid with a first bias voltage relative to said cathode to preclude transmission of said electron beam during a portion of a full cycle of said television signal;

a drift tube coupled to said anode and surrounding said beam and including a first portion and a second portion, a gap being defined between said first and second portions;

an output cavity coupled with said drift tube, said density modulated beam passing across said gap and coupling an amplified signal into said cavity; and a collector spaced from said drift tube, electrons of said beam passing into said collector after transit across said gap, said collector having a first electrode stage provided by said second portion of the drift tube and having a first electric potential applied thereto equal to that of said anode, and a second electrode stage having a second electric potential with respect to said cathode approximately 50% of said potential of said cathode.

8. The amplifying apparatus of claim 7, further comprising a third collector electrode stage having a third electric potential equal to said potential of said cathode.

9. The amplifying apparatus of claim 7, wherein said electric potential applied to said first collector electrode stage precludes collection of said electrons at said anode potential.

10. An amplifying apparatus, comprising:

an electron gun assembly having a cathode and an anode spaced therefrom, said cathode being coupled to a voltage source providing said cathode with a relatively high voltage potential relative to a corresponding potential of said anode, said cathode providing an electron beam in response to said relatively high voltage potential;

an input source providing an input signal comprising a radio frequency carrier modulated by a digital television signal, said input signal having a statistical power distribution corresponding to a high ratio of peak to average power;

a control grid spaced between said cathode and anode, and being coupled to said input source to apply said input signal to said grid in order to density modulate said beam, said grid being coupled to a first bias voltage source providing said grid with a first bias voltage relative to said cathode to preclude transmission of said electron beam during a portion of a full cycle of said input signal;

a drift tube spaced from said electron gun and surrounding said beam and including a first portion and a second portion, a gap being defined between said first and second portions;

an output cavity coupled with said drift tube, said density modulated beam passing across said gap and coupling an amplified signal into said cavity; and a collector spaced from said drift tube, the electrons of said beam passing into said collector after transit across said gap, said collector having a plurality of electrode stages each having a respective electric potential applied thereto ranging between said anode potential and said cathode potential, said respective electrode stage potentials having corresponding voltage values selected in correspondence with said statistical power distribution of said input signal.

11. The amplifying apparatus of claim 10, wherein said plurality of electrode stages comprises a first electrode stage provided by said second portion of said drift tube and having a first electric potential applied thereto equal to that of said anode, and a second electrode stage having a second electric potential with respect to said cathode approximately 50% of said potential of said cathode.

12. The amplifying apparatus of claim 11, further comprising a third collector electrode stage having a third electric potential equal to said potential of said cathode.

13. The amplifying apparatus of claim 11, wherein said electric potential applied to said first collector electrode stage precludes collection of said electrons at said anode potential.

14. A method for amplifying an input signal comprising the steps of:

accelerating an electron beam from an electron gun assembly, having a cathode and an anode spaced therefrom, by application of a relatively high potential between said cathode and said anode;

density modulating said electron beam by application of said input signal to a control grid disposed between said cathode and said anode;

biasing said control grid relative to said cathode to preclude transmission of said electron beam during a portion of a full cycle of said input signal;

inducing an amplified output signal into an output transformer by passing said density modulated beam across a gap coupled across said output transformer; and collecting the electrons of said beam remaining after transit across said gap on a plurality of collector stages, each one of said plurality of collector stages having a respective electric potential applied thereto ranging between a ground and a full electric potential of said beam.

15. The method of claim 14, wherein said collecting step further comprises applying said electric potential equal to full beam potential to a first one of said plurality of collector stages, and applying an electric potential depressed to a fraction of said full beam potential to a second one of said plurality of collector stages.

16. The method of claim 14, further comprising the step of selecting said respective electric potentials applied to said corresponding collector stages to preclude collection of said electrons at the full electric potential of said beam.

17. The method of claim 14, wherein said input signal further comprises a low frequency RF signal.

18. The method of claim 14, further comprising the step of precluding respective RF fields from forming between adjacent ones of said plurality of collector stages.

19. An amplifying apparatus, comprising:
an electron gun assembly having a cathode and an anode spaced therefrom, said cathode being coupled to a voltage source providing said cathode with a relatively high voltage potential relative to a corresponding potential of said anode, said cathode providing an electron beam in response to said relatively high voltage potential;
a control grid spaced between said cathode and anode, and being coupled to an input source that applies a radio frequency signal to said grid in order to density modulate said beam, said radio frequency signal having a statistical power distribution corresponding to a high ratio of peak to average power, said grid being coupled to a first bias voltage source providing said grid with a first bias voltage relative to said cathode to preclude transmission of said electron beam during a portion of a full cycle of said radio frequency input signal;
a drift tube spaced from said electron gun and surrounding said beam and including a first portion and a second portion, a gap being defined between said first and second portions;
an output cavity coupled with said drift tube, said density modulated beam passing across said gap and coupling an amplified radio frequency signal into said cavity; and
a collector spaced from said drift tube, the electrons of said beam passing into said collector after transit across said gap, said collector having a plurality of electrode stages, each one of said plurality of electrode stages having a respective electric potential applied thereto ranging between said anode potential and said cathode potential, said respective electrode stage potentials having corresponding voltage values to substantially reduce power input to said apparatus for said statistical power distribution of said radio frequency signal across a power range of said radio frequency signal in comparison to a conventional amplifying apparatus comprised of an electron gun assembly, control grid, drift tube and output cavity substantially as set forth above and a collector having a single stage collector electrode.

20. The apparatus of claim 19, further comprising means disposed within said cavity for extracting said amplified radio frequency signal from said output cavity.

21. The apparatus of claim 19, wherein said plurality of electrode stages comprises at least two electrode stages.

22. The apparatus of claim 19, wherein said radio frequency input signal is a UHF frequency signal.

23. The apparatus of claim 19, wherein said electric potential applied to said respective collector electrodes is selected to preclude collection of said electrons at said anode potential.

24. The apparatus of claim 19, further comprising a shadow grid disposed between said control grid and said cathode.

25. The apparatus of claim 24, further comprising a second bias voltage source coupled to said shadow grid providing said shadow grid with a second bias voltage relative to said cathode.

26. The amplifying apparatus of claim 19, wherein said input signal further comprises a radio frequency carrier modulated by a digital television signal.

27. A linear amplifier, comprising:
an electron gun assembly having a cathode;
an anode spaced from said cathode;
means for applying a relatively high voltage potential between said anode and said cathode, said cathode providing an electron beam in response to said relatively high voltage potential;
a control grid spaced between said cathode and anode, said control grid being coupled to an input port adapted to receive an input signal having a high ratio of peak to average power, said input signal causing said control grid to density modulate said beam, said control grid being further coupled to a bias voltage source to preclude transmission of said electron beam during a portion of a full cycle of said input signal; and
a plurality of collector stages each having a respective electric potential applied thereto ranging between a potential of said cathode and a potential of said anode to efficiently collect said electrons of said beam after passing said anode, a first one of said collector stages being spaced from said anode opposite from said control grid and coupled to an output port, said output port providing an amplified output signal therefrom, said respective electric potentials of said collector stages having corresponding voltage values such as to provide near-constant and high efficiency across a power range of said input signal, wherein said plurality of collector stages are coupled to said respective electric potentials through insulated conductors disposed within a single resonator.

28. The linear amplifier of claim 27, wherein said common resonator further comprises a helix tube.

29. An amplifying apparatus, comprising:
an electron gun assembly having a cathode and an anode spaced therefrom, said cathode being coupled to a voltage source providing said cathode with a relatively high voltage potential relative to a potential of said anode, said cathode providing an electron beam in response to said relatively high voltage potential;
a control grid spaced between said cathode and anode, and being coupled to an input source that applies a radio frequency signal to said grid in order to density modulate said beam, said radio frequency signal having a statistical power distribution corresponding to a high ratio of peak to average power, said grid being coupled to a first bias voltage source providing said grid with a first bias voltage relative to said cathode to preclude transmission of said electron beam during a portion of a full cycle of said radio frequency input signal;
a drift tube spaced from said electron gun and surrounding said beam and including a first portion and a second portion, a gap being defined between said first and second portions;

an output cavity coupled with said drift tube, said density modulated beam passing across said gap and coupling an amplified radio frequency signal into said cavity; and a collector spaced from said drift tube, the electrons of said beam passing into said collector after transit across said gap, said collector having a plurality of electrode stages each having a respective electric potential applied thereto ranging between said anode potential and said cathode potential, said respective electrode stage potentials having corresponding voltage values to substantially reduce power input to said apparatus for said statistical power distribution of said radio frequency signal across a power range of said radio frequency signal in comparison to a conventional amplifying apparatus comprised of an electron gun assembly, control grid, drift tube and output cavity substantially as set forth above and a collector having a single stage collector electrode, wherein one of said plurality of electrode stages has a respective electric potential equal to a fraction of said cathode potential.

30. The amplifying apparatus of claim 29, wherein said radio frequency signal further comprises a radio frequency carrier modulated by a digital television signal.

31. An amplifying apparatus, comprising:

an electron gun assembly having a cathode and an anode spaced therefrom, said cathode being coupled to a voltage source providing said cathode with a relatively high negative voltage potential relative to a corresponding potential of said anode, said cathode providing an electron beam in response to said relatively high negative voltage potential;

a control grid spaced between said cathode and anode, and being coupled to an input source that applies a television signal to said grid in order to density modulate said beam, said television signal having a statistical power distribution corresponding to a high ratio of peak to average power, said grid being coupled to a first bias voltage source providing said grid with a first bias voltage relative to said cathode to preclude transmission of said electron beam during a portion of a full cycle of said television signal;

a drift tube coupled to said anode and surrounding said beam and including a first portion and a second portion, a gap being defined between said first and second portions;

an output cavity coupled with said drift tube, said density modulated beam passing across said gap and coupling an amplified signal into said cavity; and a collector spaced from said drift tube, electrons of said beam passing into said collector after transit across said gap, said collector having a first electrode stage provided by said second portion of the drift tube and having a first electric potential applied thereto equal to that of said anode, and a second electrode stage having a second electric potential with respect to said cathode greater than 50% of said potential of said cathode, said second electrode stage potential substantially reducing power input to said apparatus for said statistical power distribution of said signal across a power range of said signal in comparison to a conventional amplifying apparatus comprised of an electron gun assembly, control grid, drift tube and output cavity substantially as set forth above and a collector having a single stage collector electrode.

32. The amplifying apparatus of claim 31, further comprising a third collector electrode stage having a third electric potential equal to said potential of said cathode.

33. The amplifying apparatus of claim 31, wherein said television signal further comprises a radio frequency carrier modulated by digital television signal.

34. The apparatus of claim 31, wherein said apparatus further comprises a linear amplifier.

35. The amplifying apparatus of claim 31, further comprising inductive means disposed within said cavity for extracting said amplified signal from said output cavity.

36. The apparatus of claim 31, wherein said electric potential applied to said first collector electrode stage precludes collection of said electrons at said anode potential.

37. The apparatus of claim 31, wherein said first and second collector electrode stages provide said apparatus with consistently high efficiency across said power range.

38. A method for amplifying a television signal, said method comprising the steps of:

accelerating an electron beam from an electron gun assembly having a cathode and an anode spaced therefrom by application of a relatively high voltage potential to said cathode relative to a corresponding potential of said anode;

density modulating said electron beam by application of said television signal to a control grid disposed between said cathode and said anode, said television signal having a particular statistical power distribution providing a high ratio of peak to average power;

electrically biasing said control grid relative to said cathode to preclude transmission of said electron beam during a portion of a full cycle of said signal;

passing said density modulated beam across a gap to induce an amplified signal into a cavity coupled to said gap;

extracting said amplified signal from said cavity; and collecting the electrons of said beam remaining after transit across said gap on a plurality of electrode stages, each said electrode stage having a respective electric potential applied thereto ranging between said anode potential and said cathode potential, said respective electrode stage potentials having corresponding voltage values selected in accordance with said statistical power distribution to substantially reduce power usage across a power range of said signal in comparison to a conventional method for amplifying a television signal that comprises the accelerating, density modulating, electrically biasing, passing and extracting steps substantially as set forth above with the further step of collecting the electrons of said beam remaining after transit across said gap on a single stage collector electrode.

39. The method of claim 38, further comprising the step of modulating a radio frequency carrier with a digital television signal to provide said television signal.

40. The method of claim 38, wherein said collecting step further comprises the steps of applying an electric potential equal to a potential of said anode to at least one of said electrode stages.

41. The method of claim 38, wherein said collecting step further comprises the steps of applying an electric potential equal to a fraction of said potential of said cathode to at least one of said electrode stages.

42. The method of claim 38, wherein said collecting step further comprises the steps of applying an electric potential equal to said potential of said cathode to at least one of said electrode stages.

43. The method of claim 38, wherein said collecting step further comprises the steps of applying an electric potential with respect to said potential of said cathode greater than 50% of said potential of said cathode to at least one of said electrode stages.

44. The method of claim 38, wherein said collecting step further comprises the step of providing at least two of said plurality of electrode stages.

45. The method of claim 38, further comprising the step of focusing said electron beam by providing a magnetic field at least to said gap.

46. The method of claim 38, further comprising the step of selecting said electric potential of each said stage to preclude collection of said electrons at said potential of said anode.

47. A linear amplifier, comprising:
an electron gun assembly having a cathode;
an anode spaced from said cathode;
means for applying a relatively high voltage potential between said anode and said cathode, said cathode providing an electron beam in response to said relatively high voltage potential;
a control grid spaced between said cathode and anode, said control grid being coupled to an input port adapted to receive an input signal having a high ratio of peak to average power, said input signal causing said control grid to density modulate said beam, said control grid being further coupled to a bias voltage source to preclude transmission of said electron beam during a portion of a full cycle of said input signal; and
a plurality of collector stages each having a respective electric potential applied thereto ranging between a potential of said cathode and a potential of said anode to efficiently collect said electrons of said beam after passing said anode, a first one of said collector stages being spaced from said anode opposite from said control grid and coupled to an output port, said output port providing an amplified output signal therefrom, said respective electric potentials of said collector stages having corresponding voltage values such as to substantially reduce power input to said linear amplifier across a power range of said input signal in comparison to a conventional linear amplifier.

48. The linear amplifier of claim 47, wherein said plurality of collector stages further comprise respective collector grids associated therewith.

49. The linear amplifier of claim 47, wherein said input port further comprises a transformer.

50. The linear amplifier of claim 47, wherein said output port further comprises a transformer.

51. The linear amplifier of claim 47, wherein said plurality of collector stages comprises at least two collector stages.

52. The linear amplifier of claim 47, wherein said first one of said collector stages has said respective electric potential equal to full beam potential, and a second one of said collector stages has said respective electric potential depressed to a fraction of said beam potential.

53. The linear amplifier of claim 47, wherein each said electric potential applied to said respective collector stages is adjusted to preclude collection of said electrons at said relatively high voltage potential.

54. The linear amplifier of claim 47, wherein said input signal further comprises a radio frequency carrier modulated by a digital television signal.

55. The linear amplifier of claim 47, wherein said plurality of collector stages are coupled together by respective capacitors to preclude RF fields therebetween.

56. The linear amplifier of claim 47, wherein said plurality of collector stages are coupled together by respective inductors to preclude RF fields therebetween.

57. The linear amplifier of claim 47, wherein said plurality of collector stages are coupled to said respective electric potentials through respective inductors.

58. The linear amplifier of claim 47, wherein said relatively high voltage potential applying means further comprises a positive voltage source coupled to said anode.

59. The linear amplifier of claim 58, wherein said cathode is coupled to ground.

60. The linear amplifier of claim 47, wherein said anode further comprises an anode grid.

* * * * *